US008395866B1

(12) United States Patent
Schreiber et al.

(10) Patent No.: US 8,395,866 B1
(45) Date of Patent: Mar. 12, 2013

(54) RESILIENT FLYING LEAD AND TERMINUS FOR DISK DRIVE SUSPENSION

(75) Inventors: Christopher Schreiber, Temecula, CA (US); Christopher Dunn, Austin, TX (US)

(73) Assignee: Magnecomp Corporation, Murrieta, CA (US)

( * ) Notice: Subject to any disclaimer, the term of this patent is extended or adjusted under 35 U.S.C. 154(b) by 731 days.

(21) Appl. No.: 12/540,870

(22) Filed: Aug. 13, 2009

Related U.S. Application Data

(63) Continuation-in-part of application No. 11/485,912, filed on Jul. 13, 2006, now Pat. No. 7,829,793, which is a continuation-in-part of application No. 11/340,298, filed on Jan. 26, 2006, now Pat. No. 7,781,679.

(60) Provisional application No. 60/715,854, filed on Sep. 9, 2005.

(51) Int. Cl.
*G11B 5/48* (2006.01)
(52) U.S. Cl. .................................. 360/245.9; 360/245.8
(58) Field of Classification Search ..... 360/245.8–245.9
See application file for complete search history.

(56) References Cited

U.S. PATENT DOCUMENTS

| | | | |
|---|---|---|---|
| 3,645,861 A | | 2/1972 | Garvey |
| 3,657,003 A | | 4/1972 | Kenney |
| 3,669,851 A | | 6/1972 | Garvey |
| 4,422,906 A | * | 12/1983 | Kobayashi ............... 205/218 |
| 5,160,552 A | | 11/1992 | Tomita et al. |
| 5,612,840 A | | 3/1997 | Hiraoka et al. |
| 5,645,735 A | | 7/1997 | Bennin et al. |
| 5,666,717 A | | 9/1997 | Matsumoto et al. |
| 5,687,479 A | | 11/1997 | Bennin et al. |
| 5,854,724 A | | 12/1998 | Inaba et al. |
| 6,399,899 B1 | | 6/2002 | Ohkawa et al. |
| 6,696,163 B2 | | 2/2004 | Yang |
| 6,712,625 B2 | | 3/2004 | Saito et al. |
| 6,730,597 B1 | | 5/2004 | Lu et al. |
| 6,900,967 B1 | | 5/2005 | Coon et al. |
| 6,975,488 B1 | | 12/2005 | Kulangara et al. |
| 6,995,954 B1 | | 2/2006 | Coon |
| 7,012,017 B2 | | 3/2006 | Brunner et al. |
| 7,110,222 B2 | | 9/2006 | Erpelding |
| 7,320,174 B2 | * | 1/2008 | Cowles et al. .................. 29/852 |
| 7,466,519 B2 | | 12/2008 | Wakaki et al. |
| 2004/0130877 A1 | | 7/2004 | Okubora |
| 2004/0187296 A1 | * | 9/2004 | Cowles et al. ............. 29/603.07 |
| 2004/0247921 A1 | | 12/2004 | Dodsworth et al. |
| 2005/0146403 A1 | | 7/2005 | Okubora |
| 2005/0254175 A1 | * | 11/2005 | Swanson et al. ........... 360/245.9 |
| 2006/0011471 A1 | | 1/2006 | Grippo |
| 2007/0041123 A1 | * | 2/2007 | Swanson et al. ............. 360/122 |

(Continued)

FOREIGN PATENT DOCUMENTS

JP 2010-267334 A 11/2010

OTHER PUBLICATIONS

After-Final Amendment dated Oct. 9, 2009 in U.S. Appl. No. 11/340,298.

(Continued)

*Primary Examiner* — Hoa T Nguyen
*Assistant Examiner* — Carlos E Garcia
(74) *Attorney, Agent, or Firm* — Intellectual Property Law Offices of Joel Voelzke, APC

(57) ABSTRACT

A disk drive suspension circuit has copper signal conductors connected by vias through an insulative layer to respective stainless steel flying leads. The stainless steel flying leads are activated and plated with one or more metals, with a final layer over the flying lead being a layer such as gold, suitable for bonding to form bond pads. The gold bond pads may be attached using thermosonic welding, solder ball bonding, or other suitable methods to an electrical component such as wires or a the disk drive's pre-amp circuit.

18 Claims, 14 Drawing Sheets

U.S. PATENT DOCUMENTS

2007/0236313 A1  10/2007  Wallis et al.
2009/0008133 A1   1/2009  Bullard et al.

OTHER PUBLICATIONS

Examiner Interview Summary dated Oct. 13, 2009 in U.S. Appl. No. 11/340,298.
Advisory Action dated Nov. 2, 2009 in U.S. Appl. No. 11/340,298.
Request for Reconsideration dated Nov. 17, 2009 in U.S. Appl. No. 11/340,298.
Request for Continued Examination and Amendment dated Dec. 17, 2009 in U.S. Appl. No. 11/340,298.
List of References and Advisory Action dated Dec. 18, 2009 in U.S. Appl. No. 11/340,298.
Examiner Interview Summary dated Dec. 24, 2009 in U.S. Appl. No. 11/340,298.

U.S. Appl. No. 11/340,298, Disk Drive Suspension Via Formation Using a Tie Layer and Product, Patent 7,781,697.
U.S. Appl. No. 11/485,912, Additive Disk Drive Suspension Manufacturing Using Tie Layers for Vias and Product Thereof, Patent 7,829,793.
U.S. Appl. No. 12/540,870, resilient Flying Lead and Terminus for Disk Drive Suspension, Awaiting first Office Action.
U.S. Appl. No. 12/623,983, Low Impedance, High Bandwidth Disk Drive Suspension Circuit, Awaiting first Office Action.
Claims as filed in parent U.S. Appl. No. 11/340,298, 4 pp.
Office Action dated Mar. 30, 2009 in U.S. Appl. No. 11/340,298, 11 pp.
Responsive Amendment filed Jun. 18, 2009 in U.S. Appl. No. 11/340,298, 13 pp.
Office Action dated Aug. 17, 2009 in U.S. Appl. No. 11/340,298, 15 pp.

* cited by examiner

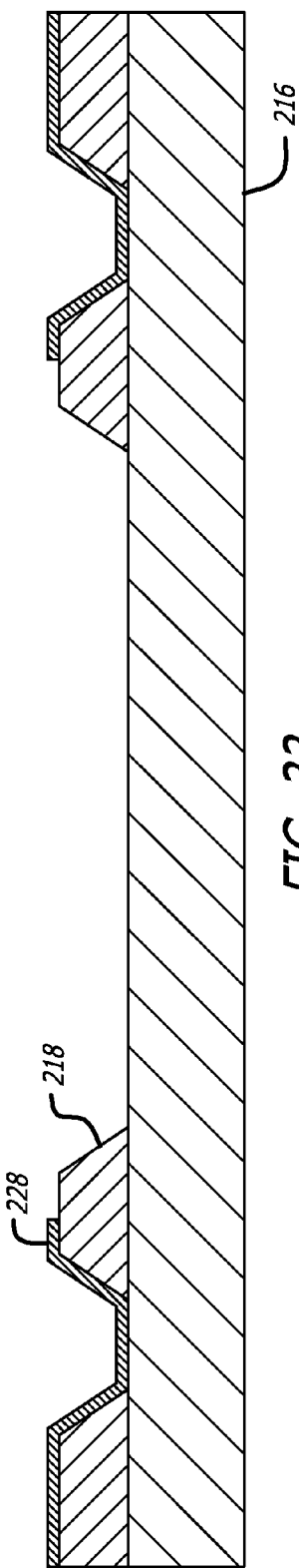
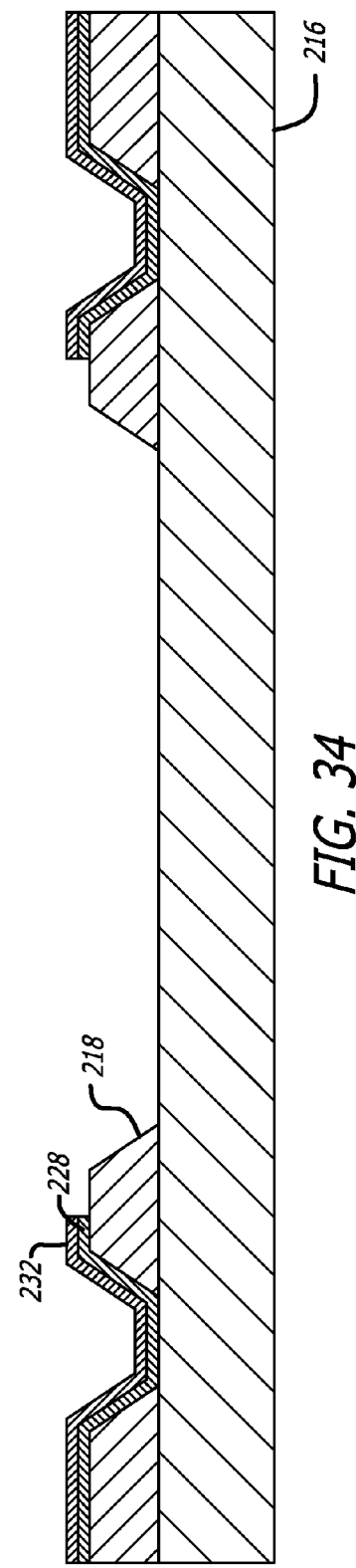

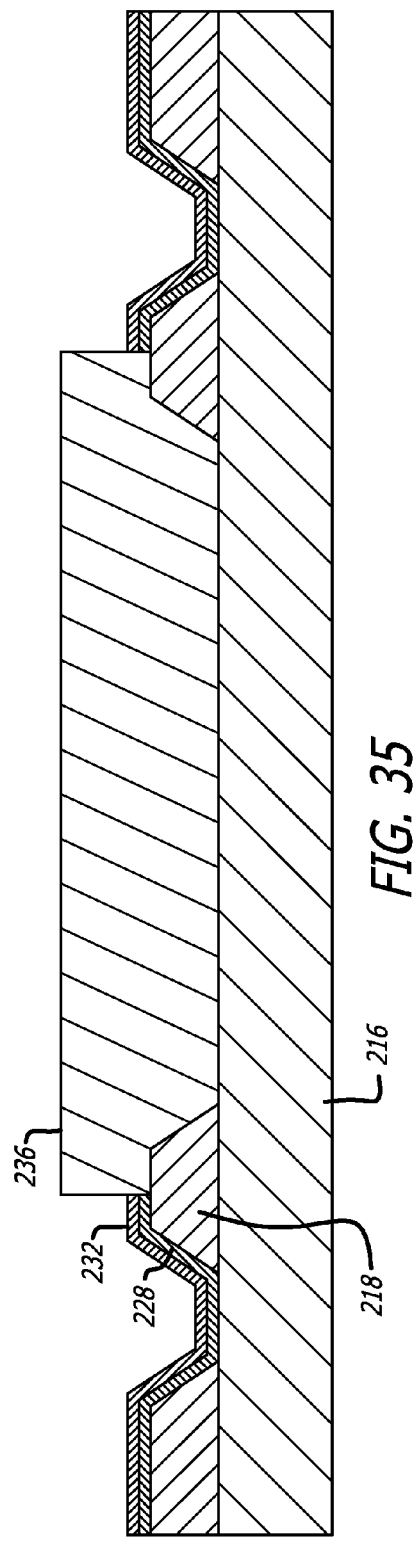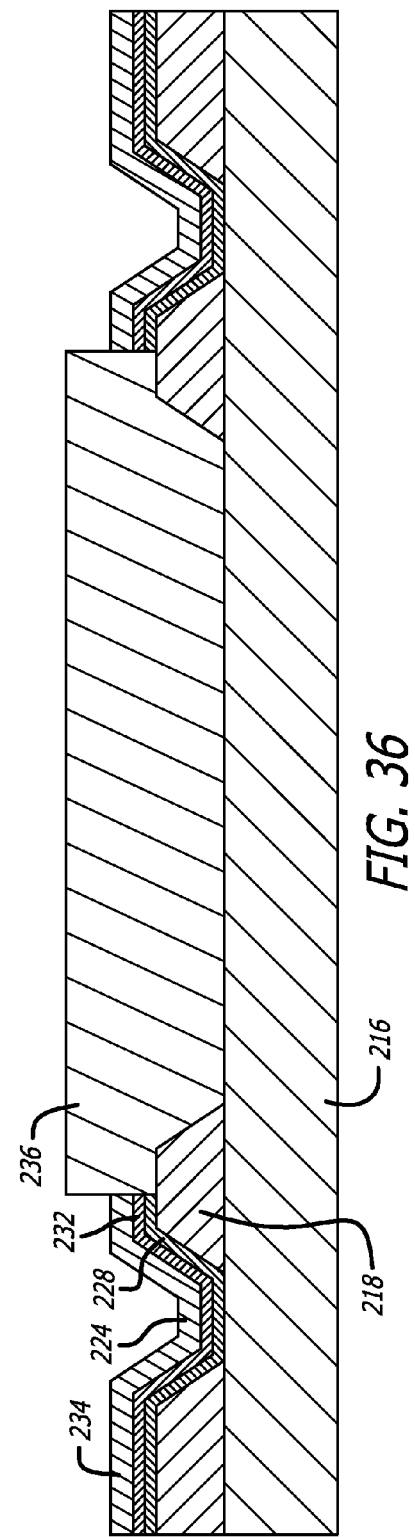

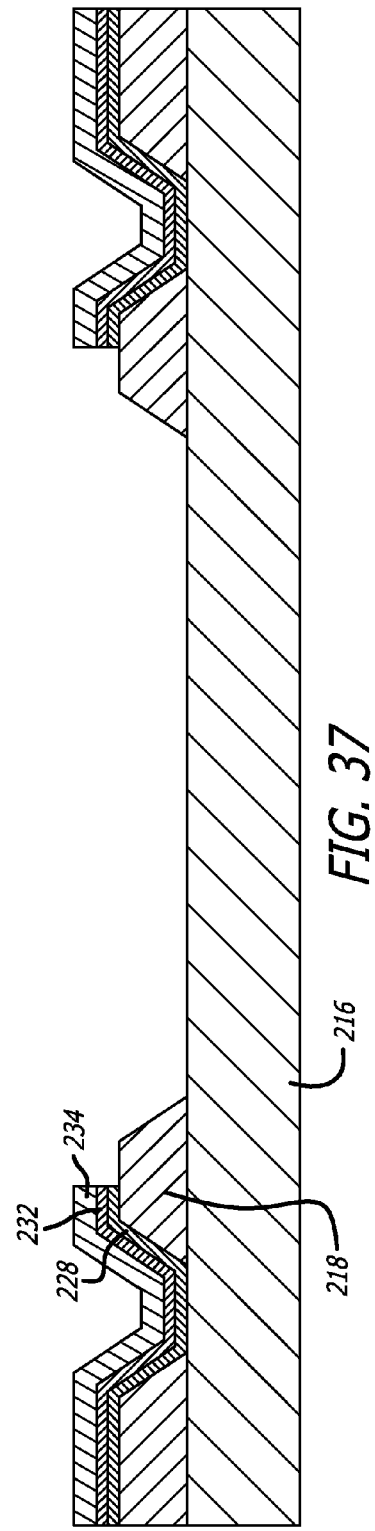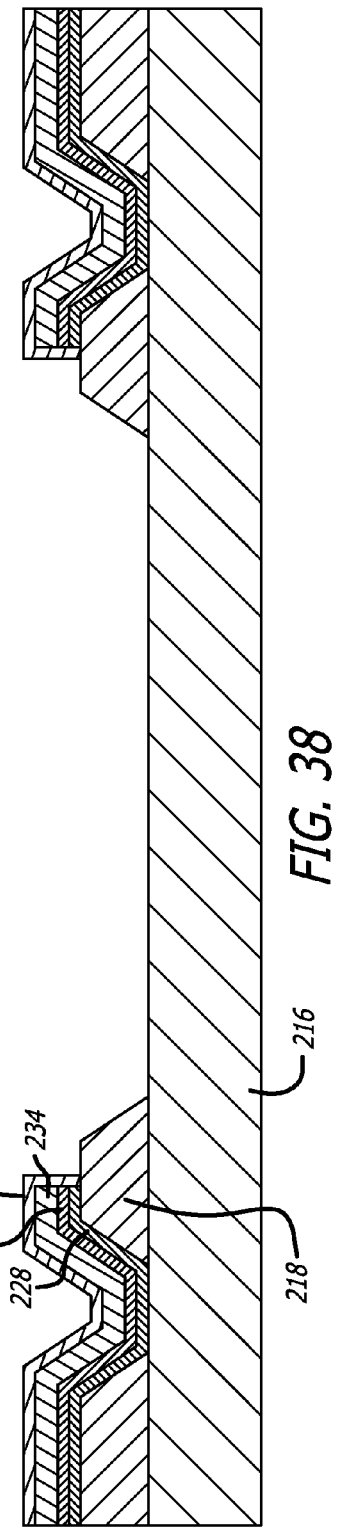

RESILIENT FLYING LEAD AND TERMINUS FOR DISK DRIVE SUSPENSION

CROSS-REFERENCE TO RELATED APPLICATIONS

This application is a continuation in part of U.S. patent application Ser. No. 11/485,912 filed Jul. 13, 2006, which is a continuation in part of U.S. application Ser. No. 11/340,298 filed Jan. 26, 2006, which application claims the benefit of U.S. Provisional Application Ser. No. 60/715,854, filed Sep. 9, 2005, the disclosures of which are incorporated as if fully set forth herein.

BACKGROUND OF THE INVENTION

1. Field of the Invention

This invention relates to disk drive suspensions, and more particularly, to improvements in the manufacture of disk drive suspension interconnects to secure better electrical grounding of suspension components such as copper circuit layers to grounded portions of the suspension such as stainless steel layers including stainless steel layers per se and copper metallized stainless steel layers, to enable increased numbers of copper circuit layers, and further relates to suspension products thus manufactured. The invention further relates to a resilient flying lead and flying lead terminus for disk drive suspensions.

2. Description of the Related Art

Disk drive suspension interconnects, such as Integrated Lead Suspensions (ILS) for hard disk drives typically have three layers, including a stainless steel foil that provides mechanical properties for the suspension, two or more conductive traces comprising gold plated, patterned copper conductive circuits paths that provide the electrical connection between the read/write head slider and the termination pads of the suspension, and a dielectric layer that provides electrical insulation between the stainless steel foil and the conductive traces.

It is known to be desirable to ground various components of a disk drive suspension such as the body of the read/write head slider. One of the major challenges in the design of hard disk drive suspensions is attaining a suitable, reliable grounding connection between the conductive copper traces connected electrically to the slider and the underlying stainless steel foil layer given the limited space available to make the connection. The difficulty of bonding to stainless steel and dissimilarity of the metals (Cu, Au, SST) pose additional significant challenges to creating a reliable grounding of the slider, but reliable grounding is essential to maintaining the signal fidelity between the read/write head and amplifier.

Among the prior art approaches to solving the slider grounding problem is creating a hole in the dielectric between the slider and the stainless steel foil, typically 25 μm deep, and filling the hole with conductive adhesive to provide an electrical connection between the slider and the stainless steel. This approach is deficient, however, since conductive adhesive connections are typified by very high interconnect resistance resultant from the passive (self-healing) nature of the stainless steel and the lack of a conductive, fully metallic bond between the steel layer and the conductive adhesive. High interconnect resistance limits the quality of the electrical connection to ground and thus slider performance dependent on a good grounding is degraded.

Another approach to slider grounding uses a spanning lead that extends from the slider, beyond the edge of the dielectric layer and opposite the stainless steel layer where it is subsequently bent over onto the stainless steel layer and electrically and mechanically affixed there, using, typically, a conductive polymer. Spanning leads are very fragile and can be easily mis-bent during manufacture causing lowered manufacturing yields. Further, even if perfectly accomplished, the process of physically bending and adhering leads to the stainless steel suspensions is a very labor-intensive process that does not lend itself to high-volume, low-cost manufacturing, such as simultaneous gang bonding of multiple suspensions.

In both of these prior art processes the presence of conductive adhesives can cause increased drive contamination that may adversely affect drive reliability, and their use is environmentally undesirable for workers.

Additionally, it is known to provide suspension circuits having tail termination pads at the ends of the circuits, which are flying or unsupported metallic conductors. These structures, are sometimes called flying leads. One purpose of the flying lead region is to allow access to both surfaces of the conductive lead. The flying lead is typically terminated to a rigid or flexible circuit on the suspension actuator using thermosonic bonding. The flying leads have metallic conductors that are unsupported by the dielectric layer that normally separates the conductive signal traces from the other conductive layers and the substrate such as stainless steel below. The flying leads therefore lack the stiffness provided by the underlying dielectric layer. U.S. Patent Publication No. 2005/0254175 by Swanson et al. shows in FIG. 2 a flying lead region 50.

Various constructions and metallurgies have been proposed for the flying leads. Swanson et al. disclose, for example, a first embodiment of a flying lead construction in FIGS. 15A-15C in which a flying lead comprises a copper signal conductor on stainless steel with nickel and gold plating, and a second embodiment in FIGS. 17A-17C in which a flying lead comprises a copper signal conductor with nickel and gold plating. U.S. Patent Publication No. 2007/0041123 by Swanson et al. discloses a flying lead portion formed of a nobel metal. U.S. Pat. No. 5,666,717 issued to Matsumoto discloses in FIGS. 1 and 2 unsupported flying leads formed by cladding (a subtractive process), sputtering, vacuum deposition, or ion plating. Matsumoto employs a conductor metal formed of copper and nickel, and overplated with a nobel metal such as gold which is resistant to corrosion and chemical etching.

During the disk drive manufacturing process, the flying leads can be used for test purposes. U.S. Pat. No. 7,110,222 issued to Erpelding describes integrated lead suspensions and tail pad terminations of those suspensions. The tail pads can be electrically connected via soldering or thermosonic bonding, both of which are widely known and practiced in the microelectronics packaging field. U.S. Patent Publication No. 2005/0254175 by Swanson et al. in FIG. 2 shows a test pad portion 46 on the side of the flying leads away from the suspension. Such a test pad portion is typically used to test the completed suspension assembly. If it is found that a read-write head, also referred to as a slider, on a suspension assembly is defective, the head must be replaced by parting the flexure tail bond and replacing the head. On the other hand if the read/write head passes its tests, typically the test pad portion 46 is cut off as no longer necessary, and the suspension is integrated into a completed disk drive unit. The fragile unsupported lead is prone to damage during assembly, test, or when separating the ultrasonic or solder terminal of this terminus for rework. In recent years, as the thickness of the copper conductor layer has decreased from about 12 μm to about 7 μm in the last few years, the lead has become even more fragile, making rework even more difficult.

Traditional methods of increasing the strength of these delicate unsupported flying leads include the use of copper alloys such as beryllium copper alloy as taught by Bennin et al. in U.S. Pat. Nos. 5,645,735 and 5,687,479, or less toxic copper alloy alternatives such as NK120 or Olin 7025 alloy. Other efforts have focused on methods of distributing the high stress on the terminations at the point of highest strain, where the unsupported leads emerge from the polyimide. An unintended drawback to increasing the toughness of the copper conductor by substituting a stronger copper alloy for use in the suspension signal traces, is that doing so undesirably increases the gimbal stiffness, whereas decreased gimbal stiffness is desired for the emerging smaller read/write heads.

The methods of Swanson et al. and Matsumoto et al. may provide a more rigid tail flying lead terminus than in prior flying leads; however, they require subsequent metal electrodeposition upon dissimilar metals. This is particularly problematic in the case of a copper conductor upon an inert steel, as the presence of the inherent passive amorphous oxide which inherently forms on stainless steel is not readily receptive to acceptable adhesion of subsequent metal deposition.

BRIEF SUMMARY OF THE INVENTION

It is an object of the invention to provide in disk drive suspension interconnects a highly conductive connection between e.g. copper/gold and stainless steel or copper/stainless steel components of a disk drive suspension. It is a further object to provide novel and improved methods of manufacturing disk drive suspensions having this highly conductive connection using conductive adhesive-free, metallized vias extending between the copper/gold and stainless steel layer components of a disk drive suspension. A further object is to ground a disk drive suspension slider to a stainless steel layer optionally including a copper metallizing layer using the novel vias of the invention. Yet another object is the manufacture of disk drive suspension interconnects with stainless steel layer or copper/stainless steel grounded components using vias having an improved, low resistance electrical connection. A further object comprises a metallizing modification of the vias to enhance copper/stainless steel bonding and electrical connection thereby. A further object is to facilitate addition of further circuit layers through the effective use of the invention via technology. A further object is to provide substantially planar via openings to enhance the bond-affixing of other components. A further object is to provide a suspension circuit having resilient flying leads and bond pads.

These and other objects to become apparent hereinafter are realized in accordance with the invention method of manufacturing a disk drive suspension interconnect comprising a metal grounding layer, a metal conductive layer and an insulative layer between the metal grounding layer and the conductive metal layer, and a circuit component electrically connected to the conductive layer, that includes defining a grounding path from the circuit component and the conductive layer to the metal grounding layer through an aperture in the insulative layer, depositing a tie layer through the insulative layer onto the grounding layer in bonding relation with the ground layer, and depositing a conductor onto both the conductive metal layer and the tie layer in conductive metal layer and tie layer bonding relation, whereby the circuit component is bonded to the grounding layer by the conductor.

In one aspect of the invention, an additive manufacturing method is provided to connect the copper circuitry of a component such as a slider with the stainless steel part of the suspension interconnect using vias modified in manufacture to have better electrical connection than available heretofore.

In one aspect, the invention provides optimal performance in hard disk drive sliders by improving the electrical grounding thereof through a via having a copper conductor bonded to a stainless steel layer using a tie layer of chromium and optionally a copper flash layer as well.

In this and like embodiments, typically, the method includes selecting a stainless steel material as the grounding layer, selecting a copper metallized stainless steel as the grounding layer, selecting a copper material as the metal conductive layer, selecting a synthetic organic polymer as the insulative layer, such as a polyimide, selecting a copper material as the conductor, selecting a chromium material as the tie layer depositing a seed copper material layer with the tie layer, electrodepositing a copper material layer with the seed copper material layer, and selecting a slider as the circuit component.

The invention further provides a disk drive suspension interconnect comprising a metal grounding layer, a metal conductive layer and an insulative layer between the metal grounding layer and the conductive metal layer, and a circuit component electrically connected to the conductive layer, the insulative layer defining an aperture providing a grounding path from the circuit component and the conductive layer to the metal grounding layer, a tie layer bonded to the grounding layer within the aperture, and a conductor bonded to the grounding layer through the tie layer and to the conductive metal layer in circuit component grounding bonding relation.

In this and like embodiments, typically, the grounding layer comprises stainless steel or copper metallized stainless steel, the metal conductive layer comprises copper, the insulative layer comprises a synthetic organic polymer, such as a polyimide, the conductor comprises copper, the tie layer comprises chromium, there is also a seed layer comprising copper within the aperture, the grounding layer comprises stainless steel or copper metallized stainless steel, the metal conductive layer comprises copper, the insulative layer comprises a synthetic organic polymer such as a polyimide, and a copper layer electrodeposited onto the copper seed layer, and the circuit component comprises a slider.

In another aspect, the invention provides a tougher, more resilient unsupported flying lead in the tail termination area for increased strength in that fragile area, while at the same time allowing a soft metal to be used for the signal trace in the gimbal area for gimbal flexibility, such as pure soft ductile copper. In this aspect, the flying lead comprises stainless steel with a gold plated coating. Prior to gold plating, the stainless steel may be activated by the use of concentrated acids preferably in the presence of reverse polarity current (electropolish). In this embodiment, the signal travels from the soft ductile copper signal trace through a via to the tough stainless steel substrate, through the flying lead which is comprised of the substrate, and back up to the copper signal conductor on the other side of the flying lead through a second via. The stainless steel flying lead may be coated with gold and/or nickel for corrosion resistance, wetability, and/or for thermosonic bonding. The stainless steel flying lead need not include any copper signal conductor.

Alternatively, instead of plating gold directly on the stainless steel (SST) flying lead, a layer of copper or nickel may be strike plated upon the stainless steel lead in order to enhance the wetability of the plated gold layer. The nickel may be plated using a "Woods Strike" or variations on the Woods Strike which by themselves are known, such as taught in U.S. Pat. No. 3,645,861 issued to Garvey.

The final metallurgy of the flying lead in the unsupported may be, for example, one of the following: SST/Au; SST/Ni/Au; SST/Cu/Au; SST/Cu/Ni/Au; SST/Ni/Cu/Ni/Au; or other variations.

In this aspect, the invention is of a circuit for a disk drive suspension, the circuit having a flexible circuit portion, a flying lead portion being of a relatively resilient material such as stainless steel, with the flexible circuit portion being electrically connected to the flying lead portion through a via. The first flexible circuit portion has a read/write signal conductor of a relatively soft material such as ductile copper, the copper being separated from the generally flat stainless steel foil underneath it via an insulative or dielectric material. The via electrically connects the copper conductor to the stainless steel foil beneath. The flying lead portion is defined by the portion of the circuit that has substantially no insulative material on at least one side and commonly on both sides, separating the flying leads from one another. The stainless steel flying lead is covered by a bond-receptive layer such as plated gold, with the bond-receptive layer being suitable for bonding to the flying lead by, for example, thermosonic bonding or solder ball bonding. The bond-receptive layer renders the flying lead receptive to bonding to an external electrical component such as a wire, an integrated circuit lead, leads on a pre-amplifier, or any other electrical component.

In one embodiment the flying leads may be configured and arranged as parallel strips or ribbons. In another embodiment the flying leads may be configured especially for solder ball bonding, with each individual flying lead being generally circular and having a hole therethrough for receiving the solder ball, or using other industry-recognized or otherwise suitable solder ball bonding pad configurations.

BRIEF DESCRIPTION OF THE DRAWINGS

The invention will be further described in conjunction with the attached drawings in which:

FIGS. 30-42 illustrate the process flow for forming a resilient flying lead according to an embodiment of the invention;

DETAILED DESCRIPTION OF THE INVENTION

The invention provides a simpler and more economical solution than those criticized above for manufacturing suspension interconnects having a reliable electrical connection between the circuit components to be grounded and the grounding layer of a stainless steel foil by creating a metallized via between them. It is well known that there are inherent difficulties in making electrical connections to stainless steel. In the invention, however, these difficulties are avoided or obviated by using a sputtered tie layer such as chromium that can be used to attach a conductor, e.g. copper, attached to a component, e.g. a slider, to a ground such as stainless steel. FIGS. 1-11 show the invention process flow for creating a metal via between the copper circuit and stainless steel layers on a hard disk drive suspension interconnect. FIGS. 15-27 show the invention process flow for creating a metal via between the copper circuit and stainless steel coated with conductive copper layer.

Suspension interconnects having multiple conductor layers can comprise three layers including top and bottom layers consisting of metallic, e.g. stainless steel and copper (preferably copper for traces) and a thin insulating layer such as a plastic layer or film preformed or formed in situ sandwiched between them. These layers are preferably formed by the additive process where the several layers are built up into a laminate assembly. In a less preferred subtractive process, a preformed laminate assembly is treated to selectively remove portions of the layers until the desired reduced ("subtractive") product is achieved. In a typical case, a pair of upper and lower traces operatively associated on the insulative film layer form a single circuit, be it a read or a write circuit.

In various embodiments, an insulating layer, a fourth layer, may be coated over the trace layer; sometimes a further conductive layer is deposited over the fourth layer to provide a five-layer structure that is supported by the load beam. Deposition of the added metal layer can be by sputtering or by electrolytic means, or a metal foil can be used.

The invention provides a disk drive suspension interconnect having one or more vias connecting electrical components connected or grounded to a ground layer through an insulative layer.

Figure 1:
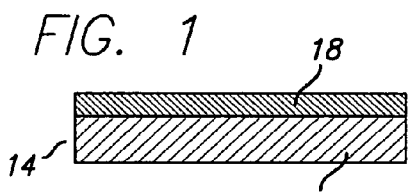
FIGS. 1 through 11 are stages of a process flow according to the invention method with the via configurations modified for illustrative purposes.
Figure 2:
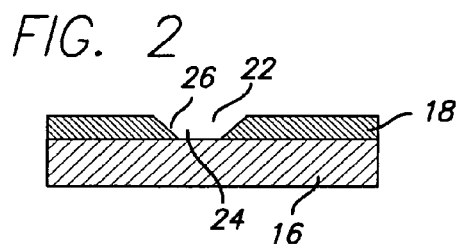
Figure 3:
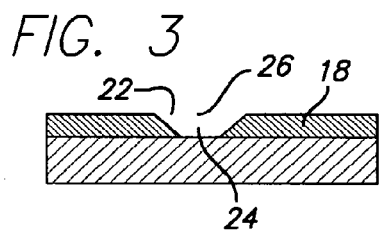

With reference to the drawings, FIGS. 1-14 show the interconnect 12 product and the process of forming the interconnect or flexible circuit. The additive process begins in FIG. 1 with a substrate 14 comprising stainless steel 16 and a typically polyimide or polyester electrically insulative layer 18 that can be cast directly onto the stainless steel. In FIG. 2, a hole 22 where the via 24 is to be formed is shaped as an aperture 26 projecting not more than about 5 microns photochemicaly, by laser drilling, by the use of photosensitive polyimide resin or chemically by etching, or otherwise, along with any fiducials (not shown) deemed to be needed into the polyimide layer 18, e.g. at a wall slope of preferably about 75 degrees and ranging from about 50 to 60 degrees to about 85 to 90 degrees provided the slope is such that sputtering can be effectively performed to metallize the via. In FIG. 3 the resulting apertured laminate insulative layer 18 is plasma or otherwise cleaned to remove any scum layer left at the bottom of the intended via 24. Hole 22 is relatively small in diameter enabling placement of several on a typically quite small suspension interconnect 12.

Figure 4:
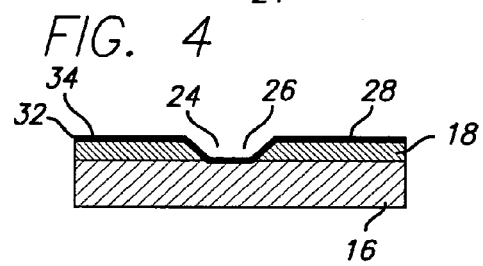

In FIG. 4, a chromium tie layer 28 is sputtered or otherwise deposited onto the insulative layer 18 and into aperture 26. "Chromium" herein includes alloys of chromium in which chromium is the largest single constituent by weight. Monels® are useful. Preferably a copper seed layer 32 is further added on top of the polyimide layer 18 and tie layer 28 and down into the aperture 26 from which the via 24 is to be made. Typically a chromium tie layer 28 will be used and will be between 100 Å and 800 Å thick. The copper seed layer 32 when used typically will be between 500 Å and 1500 Å thick.

Figure 5:
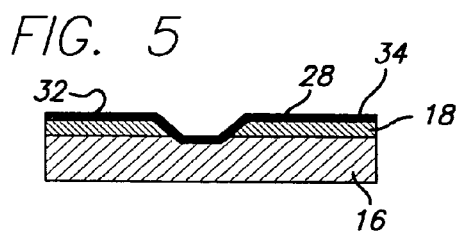

In FIG. 5, a thin layer 34 of copper (including alloys of copper) is electrodeposited in those cases where subsequent high speed plating will be carried out, as the presence of a flash plated copper layer 34 tends to build up the copper seed layer 32 thickness and provide a copper build-up to a thickness between 1 μm and 5 μm which is desirable for high speed copper plating.

Figure 6:
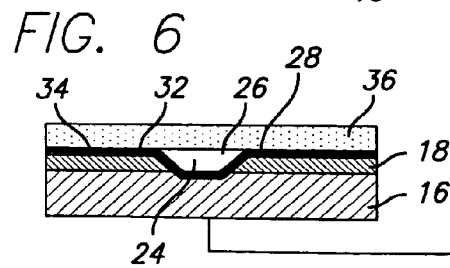

In FIG. 6 a photoresist layer 36 is deposited on top of the tie, seed and electrode posit layers 28, 32 and 34, respectively.

Figure 7:
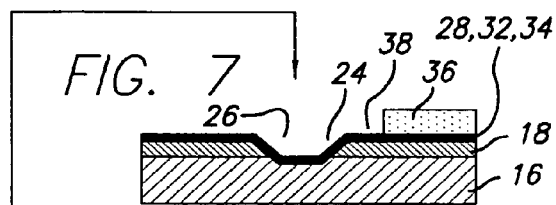

In FIG. 7, after reregistering, the photoresist layer 36 is exposed and developed in a manner leaving openings 38 in the resist layer where circuit features are to be connected to ground.

Figure 8:
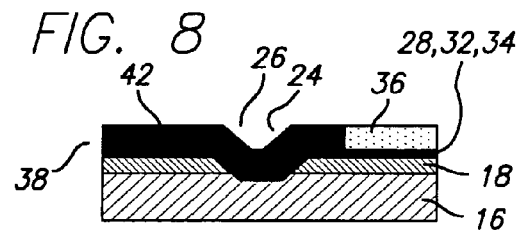

In FIG. 8, openings 38 in the photoresist layer 36 are finally copper plated, e.g. to form a copper plate 42 having a thickness of about 5 pm to about 20 pm from which suspension interconnect conductive layer comprising conductive traces 44 is formed.

Figure 9:
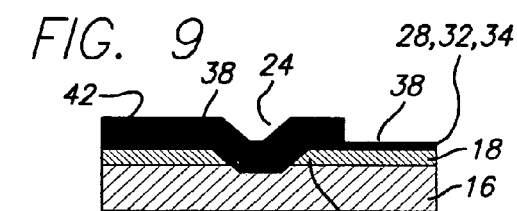

In FIG. 9, the photoresist layer 36 is stripped to expose the flash plated copper layer 34.

Figure 10:
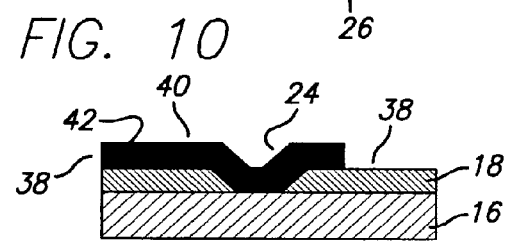

In FIG. 10, a flash etch locally removes the exposed chromium tie layer 28, copper seed layer 32, and electrodeposited flash copper 34, where used, so that the remaining copper circuit features 40 are electrically isolated. Suitable etchants for the etch step include potassium permanganate for the chromium tie layer and cupric chloride for the copper layers.

Figure 11:
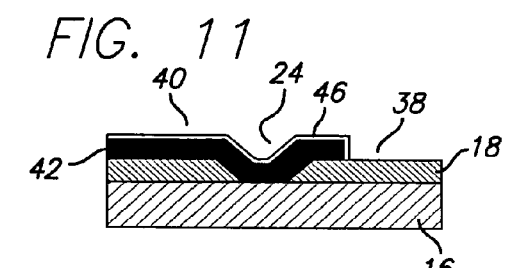

In FIG. 11, the copper features 40 are plated with gold layer 46 producing the metallized via 38 of the invention.

Figure 12:
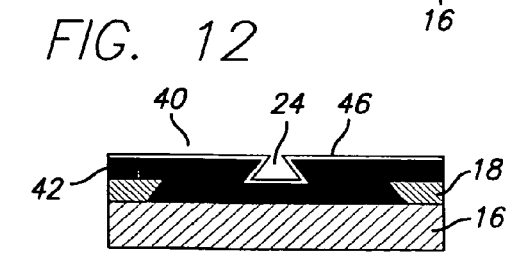
FIG. 12 is a view like FIG. 11, but of a more typical configuration of the via realized in accordance with the invention.

In FIG. 12, a more typical configuration of the via is depicted with like numerals to those numerals in FIGS. 1-11 for like parts.

Figures 13, 14:
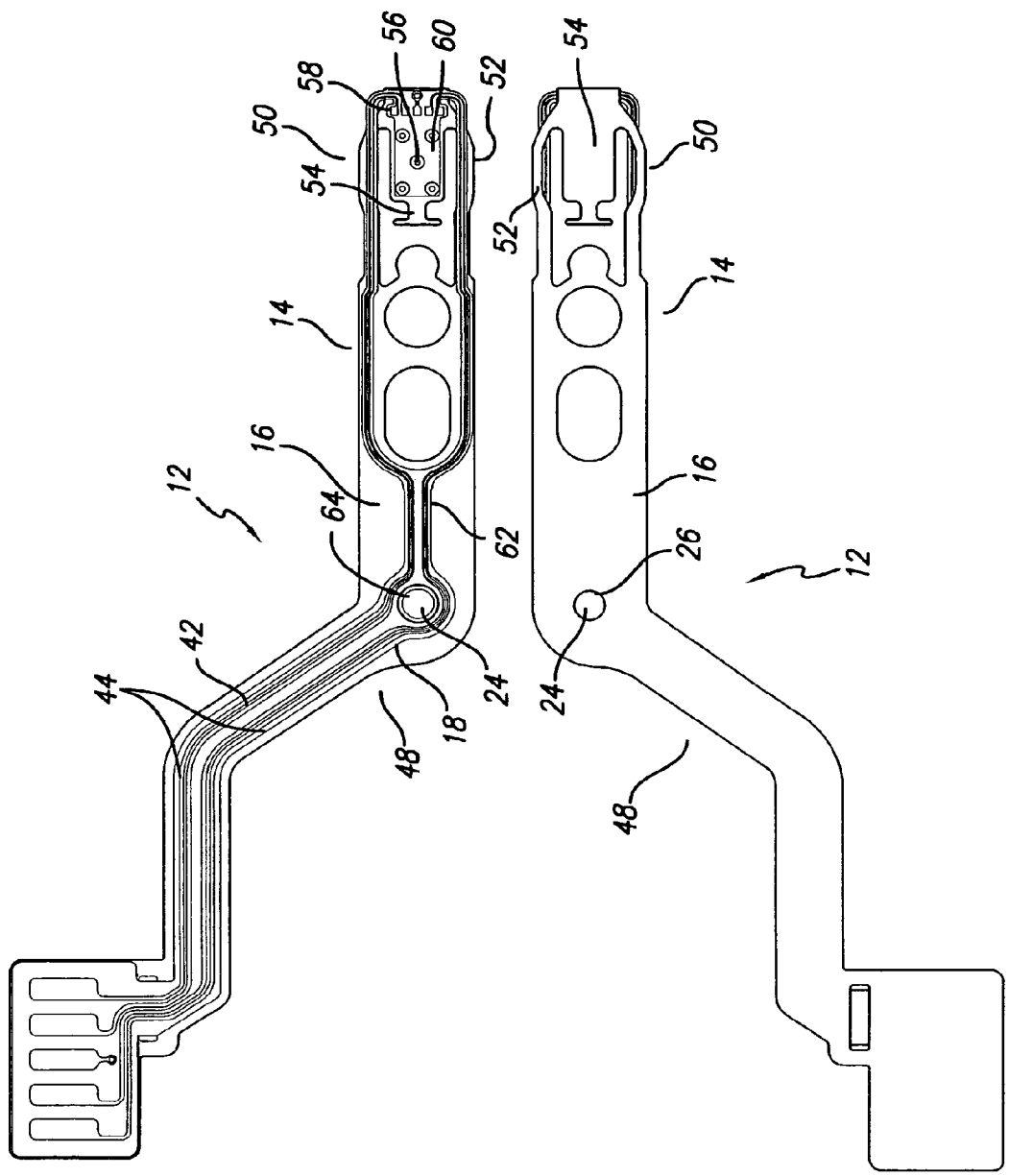
FIG. 13 is a bottom plan view of a disk drive suspension interconnect according to the invention.
FIG. 14 is a top plan view thereof.
Figure 15:
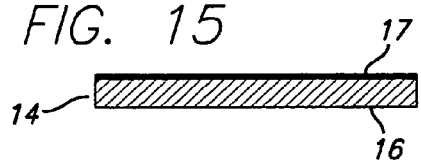
FIGS. 15-27 are stages of an alternate process flow according to the invention method.

With reference to FIGS. 13-14, suspension interconnect 12 includes a flexure 50 formed from the substrate metal layer 76 to have a frame 52 and a tongue 54 supporting a slider 60 electrically connected to the conductive traces 44 at 58. For purposes of grounding a circuit component 56 such as the slider 60 to metal layer 16, via 24 connects a grounding lead 62 extending from the slider to the via and through the metallized via to the stainless steel metal layer 16 which is itself grounded by means not shown.

Figure 16:
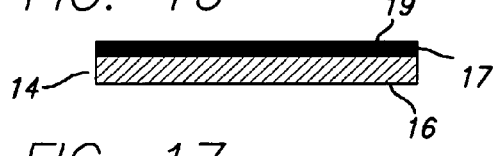
Figure 17:
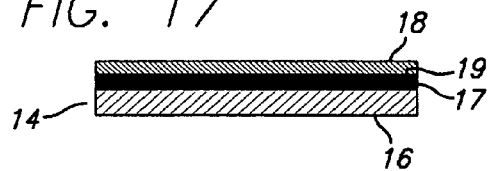
Figure 18:
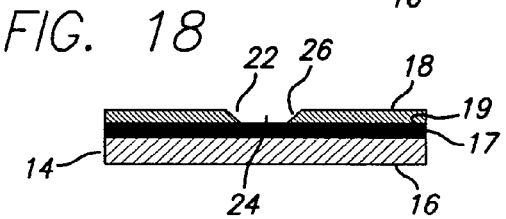
Figure 19:
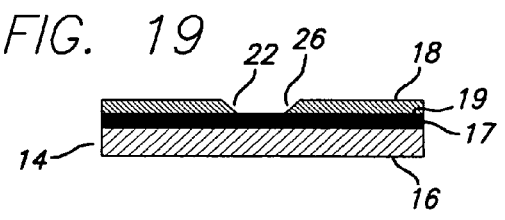

With reference to FIGS. 15-26 interconnect or flexible circuit 12 is formed by an alternative method, one using a pre-copper coated stainless steel starting material. The additive process begins in FIG. 15 with a substrate 14 comprising stainless steel 16 that is sputtered with a metallizing layer 17 comprising a seed layer and a thin copper layer. In FIG. 16 the metallizing layer 17 is electroplated with a highly conductive layer 19 on the surface of the stainless steel metallizing layer 17 that is 1-6 μm thick. In FIG. 17 a typically polyimide or polyester electrically insulative layer 18 is cast directly onto the now metallized stainless steel 16. In FIG. 18, a hole 22 where the via 24 is to be formed is shaped as an aperture 26 projecting not more than about 5 microns, mechanically by laser drilling, or chemically by etching, or otherwise, along with any fiducials (not shown) deemed to be needed into the polyimide layer 18, e.g. at a wall slope of preferably about 75 degrees and ranging from about 50 to 60 degrees to about 85 to 90 degrees provided the slope is such that sputtering can be effectively performed to metallize the via. In FIG. 19 the resulting apertured laminate insulative layer 18 is plasma or otherwise cleaned to remove any scum layer left at the bottom of the intended via 24. Hole 22 is relatively small in diameter enabling placement of several on a typically quite small suspension interconnect 12.

Figure 20:
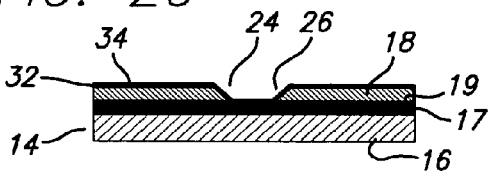

In FIG. 20, a chromium tie layer 28 is sputtered or otherwise deposited onto the insulative layer 18 and into aperture 26. "Chromium" herein includes alloys of chromium in which chromium is the largest single constituent by weight. Monels® are useful. Preferably a copper seed layer 32 is further added on top of the polyimide layer 18 and tie layer 28 and down into the aperture 26 from which the via 24 is to be made. Typically a chromium tie layer 28 will be used and will be between 100 Å and 800 Å thick. The copper seed layer 32 when used typically will be between 500 Å and 1500 Å thick.

Figure 21:
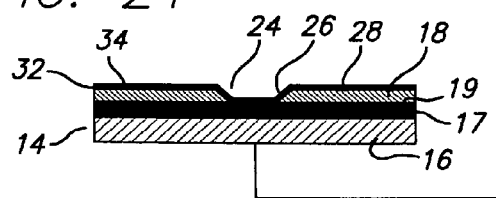

In FIG. 21, a thin layer 34 of copper (including alloys of copper) is electrodeposited in those cases where subsequent high speed plating will be carried out, as the presence of a flash plated copper layer 34 tends to build up the copper seed layer 32 thickness and provide a copper build-up to a thickness between 1 μm and 5 μm which is desirable for high speed copper plating.

Figure 22:
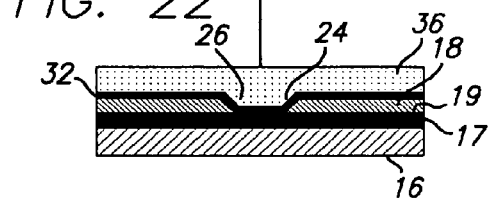

In FIG. 22 a photoresist layer 36 is deposited on top of the tie, seed and electrodeposit layers 28, 32 and 34, respectively.

Figure 23:
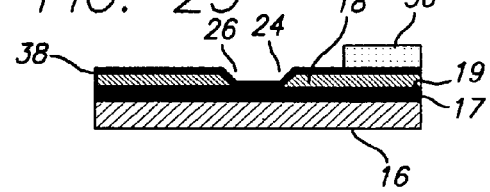

In FIG. 23, after reregistering, the photoresist layer 36 is exposed and developed in a manner leaving openings 38 in the resist layer where circuit features are to be connected to ground.

Figure 24:
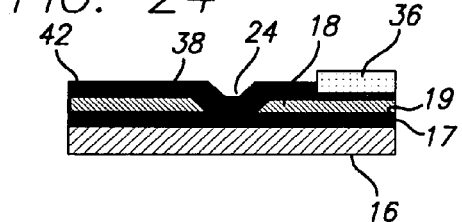

In FIG. 24, openings 38 in the photoresist layer 36 are finally copper plated, e.g. to form a copper plate 42 having a thickness of about 5 pm to about 20 pm from which suspension interconnect conductive layer comprising conductive traces 44 is formed.

Figure 25:
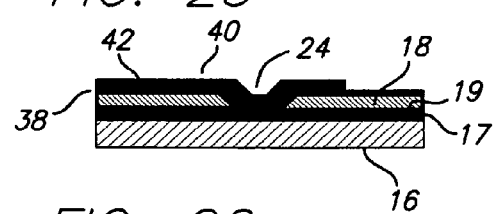

In FIG. 25, the photoresist layer 36 is stripped to expose the flash plated copper layer 34.

Figure 26:
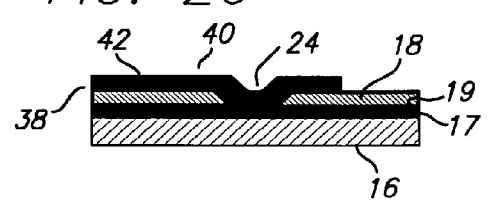

In FIG. 26, a flash etch locally removes the exposed chromium tie layer 28, copper seed layer 32, and electrodeposited flash copper 34, where used, so that remaining the copper circuit features 40 are electrically isolated. Suitable etchants for the etch step include potassium permanganate for the chromium tie layer and cupric chloride for the copper layers.

Figure 27:
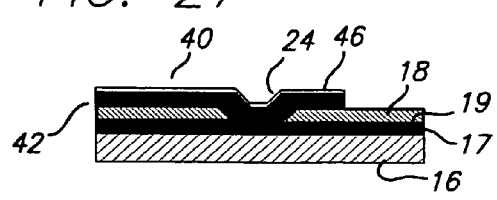

In FIG. 27, the copper features 40 are plated with gold layer 46 producing the metallized via 38 of the invention. With further reference to FIGS. 12 and 13, suspension interconnect 12 comprises a flexible circuit 48 of typically a substrate 14 comprising a stainless steel metal layer 16 (alternatively precoated with a metallizing layer 17 and electroplated layer 19 as described in reference to FIGS. 15-27) and a cast coating of a polyimide layer 18 and conductive traces 44 formed from the copper plate layer 42.

Thus, the invention method of manufacturing a disk drive suspension interconnect 12 comprising a metal grounding layer 16 (e.g. stainless steel with or without added layers of copper conductor), a metal conductive layer comprising trace conductors 44 and an insulative layer such as polyimide layer 18 between the metal grounding layer and the conductive metal layer, and a circuit component 58 such as a slider 60 electrically connected to the conductive layer traces, includes defining a grounding path 64 from the circuit component and the conductive layer to the metal grounding layer through an aperture 26 in the insulative layer, depositing a tie layer 28 through the insulative layer onto the grounding layer in bonding relation with the grounding layer, and depositing a conductor 42 onto both the conductive metal layer and the tie layer in conductive metal layer and tie layer bonding relation, whereby the circuit component is bonded to the grounding layer by the conductor.

In a further embodiment, a disk drive suspension interconnect 12 is provided comprising a metal grounding layer 16 (e.g. stainless steel with or without a copper layer), a metal conductive layer 42 and an insulative layer 18 between the metal grounding layer and the conductive metal layer, and a circuit component 58 electrically connected to the conductive layer, the insulative layer defining an aperture 26 providing a grounding path 64 from the circuit component and the conductive layer to the metal grounding layer, a tie layer 28 bonded to the grounding layer within the aperture, and a conductor 42 bonded to the grounding layer through the tie layer and to the conductive metal layer in circuit component grounding bonding relation.

In the foregoing embodiments, the method further includes selecting a stainless steel material with or without a metallizing copper layer as the grounding layer 16, selecting a copper material as the metal conductive layer 42, selecting a synthetic organic polymer as the insulative layer 18, such as a polyimide, selecting a chromium material as the tie layer 28, depositing a seed copper material layer 32 with the tie layer, electrodepositing a copper material layer 34 with the seed copper material layer, and selecting a slider 60 as the circuit component 56. Copper, a copper material, chromium, a chromium material, stainless steel or a stainless steel material, etc. herein includes materials in which the named element or alloy is the largest single constituent by weight.

In other embodiments discussed in detail below, a resilient flying lead comprises stainless steel with a bond-receptive coating such as gold on it, with vias electrically connecting the copper signal traces on either side of the flying lead to the resilient stainless steel flying lead below. The stainless steel flying lead electrically bridges two flexible circuit portions, each flexible circuit portion having a copper signal conductor supported on an insulative material such as polyimide, with vias electrically connecting each of the two flexible circuit portions to the stainless steel flying lead below. In an exemplary embodiment the only circuit path from the first flexible circuit portion to the second flexible circuit portion is down through the first via to the stainless steel flying lead, then across the flying lead including any coating thereon, then back up through the second via to the second flexible circuit portion. This is the only circuit path in the sense that, although tiny amounts of current can always leak across even insulative material, those tiny leakage currents would not be sufficient to allow the circuit to effectively operate as a disk drive suspension circuit.

Figure 28:
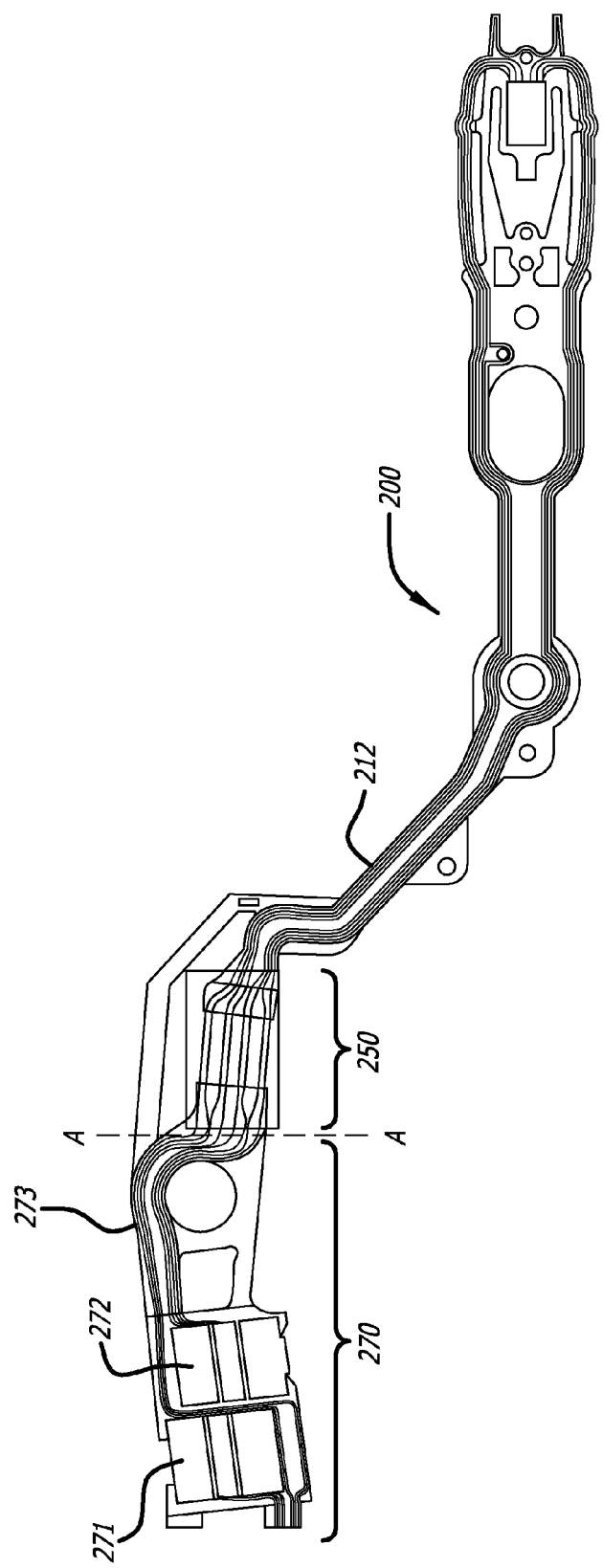
FIG. 28 is a top plan view of an exemplary suspension circuit having a flying lead region 250.

FIG. 28 is a top plan view of an exemplary suspension circuit 200 having a flying lead region 250 that electrically connects first flexible circuit portion 212 and second flexible circuit portion 273, with second flexible circuit portion 273 having a number of test pads including first test pad 271 and second test pad 272. First flexible circuit portion 212 is typically connected to the suspension's slider at the distal end of the suspension, and carries the read signals and write signals, hereafter referred to as the read/write signals, to and from the slider, as well as a ground. The flexible circuit can carry other signals including a microactuator control voltage when the suspension is a dual actuator suspension equipped with a microactuator. Typically, exposed leads within flying lead region 250 are connected to electrical components of the disk drive such as the leads of a pre-amplifier, although they could be connected to any electrical components such as wires, etc. Typically the test pads 271, 272 are used to test the suspension assembly once it is completed. If the suspension passes the test, second flexible circuit portion 273 is then severed from circuit 200 by cutting, and the suspension is then integrated into a disk drive.

Figure 29:
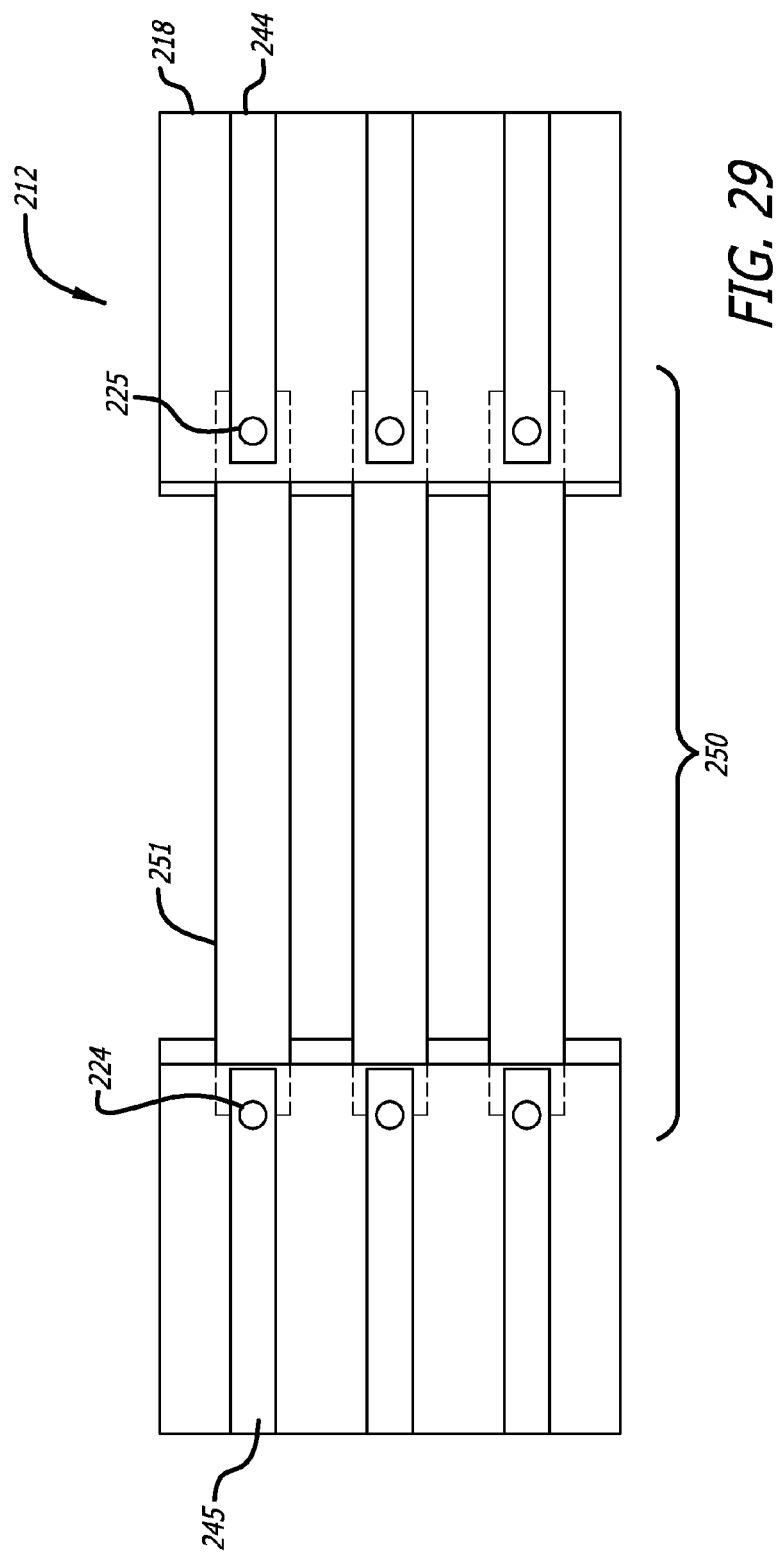
FIG. 29 is a closeup of the flying lead region 250 of FIG. 28.

FIG. 29 is a close-up view of the flying lead region 250 of FIG. 28. The read/write signals travel through first copper signal conductor 244, through first via 225, across flying lead 251, up through via 224, and to second copper signal conductor 245.

FIGS. 30-42 illustrate the process flow for forming a resilient flying lead according to an embodiment of the present invention, with a high quality electrical contact being established from the copper conductive traces to the stainless steel flying lead through vias.

Figure 30:
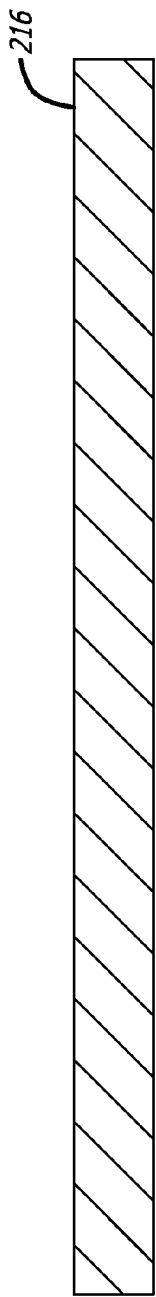

The process begins in FIG. 30 with a thin generally flat foil of resilient metal material 216 such as stainless steel. The material should be significantly stronger than pure copper, or whatever alloy of copper or other conductive material is used for trace conductors 245.

Figure 31:
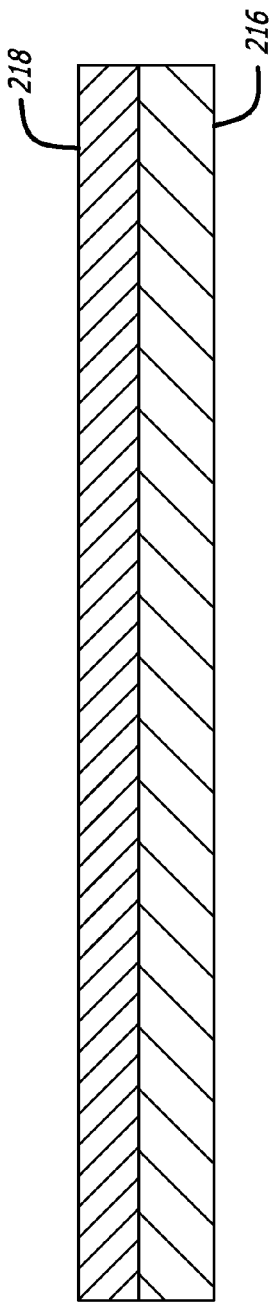

In FIG. 31 a dielectric insulative layer 218 such as polyimide or other suitable material is deposited on the stainless steel 216.

Figure 32:
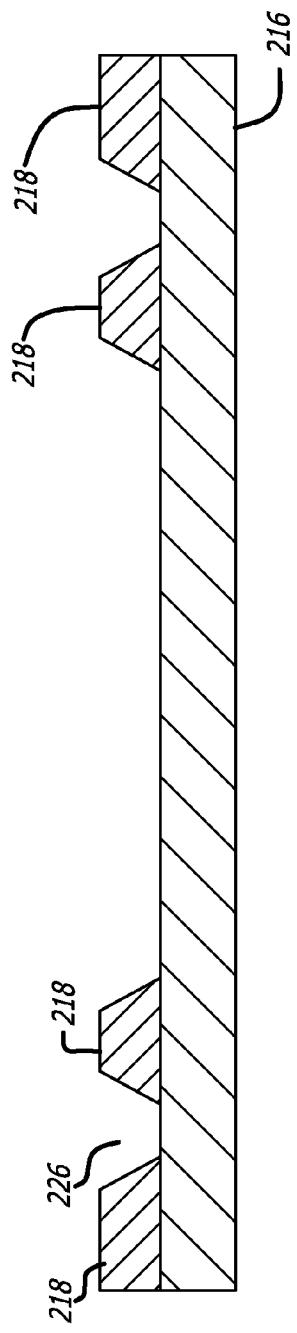

In FIG. 32, apertures 226 are then patterned in the polyimide layer 218. Apertures 226 may be patterned into polyimide 218 by the use of photosensitive polyimide, photoresist and masking, or by a laser such as may be obtained from Electro Scientific Industries, Inc. of Portland, Oreg. The use of photoresist, including laying down of a photoresist layer, masking the photoresist, exposing it to light in order to selectively harden the resist, washing away the undeveloped resist, then etching or plating the washed away areas, and then finally washing away the exposed photoresist, is a well known process that need not be discussed in detail herein.

In FIG. 33, preferably a chromium tie layer 228 is then deposited by sputtering onto the polyimide 218 and into the exposed portion of stainless steel 216 that lies within aperture 226. The chromium creates a strong chemical bond to the polyimide and forms a conductive path for the electrodeposition of conductors. Alternatively, tie layer 228 may comprise a Monel® metal. Although chromium tie layer 228 and copper seed layer 232 above it as shown in the following figures is preferably preferentially sputtered onto the areas shown by masking off the areas of polyimide 218 in which the sputtered layer is not shown as being deposited, it is not strictly necessary that chromium tie layer 228 and copper seed layer 232 be kept off of other areas including stainless steel foil 216, because it is believed that etchants that will be applied to stainless steel layer 216 as described later should sufficiently remove any chromium or copper from the stainless steel.

In FIG. 34, preferably copper seed layer 232 is then deposited by sputtering onto chromium tie layer 218. Chromium tie layer 218 and copper seed layer 232 may be deposited as discussed in greater detail above with respect to FIGS. 4 and 5.

In FIG. 35 photoresist is applied, masked, exposed, and washed to create photoresist pattern 236.

In FIG. 36 copper is electrodeposited onto the sputtered copper seed layer 232 to form copper signal conductor 234. Preferably copper signal conductor 234 is pure ductile copper that is flash electrodeposited, although copper alloys also be used. Together chromium tie layer 228, copper seed layer 232, and copper signal conductor 234 form conductive vias 224 and 225 that electrically connect copper signal traces 234 to the stainless steel 216 that will form the flying lead.

In FIG. 37 photoresist 236 is washed away.

In FIG. 38 a protective and electrically insulating cover layer 260 is applied over the copper signal conductor 234 to protect it from corrosion and electrical shorting.

Figure 39:
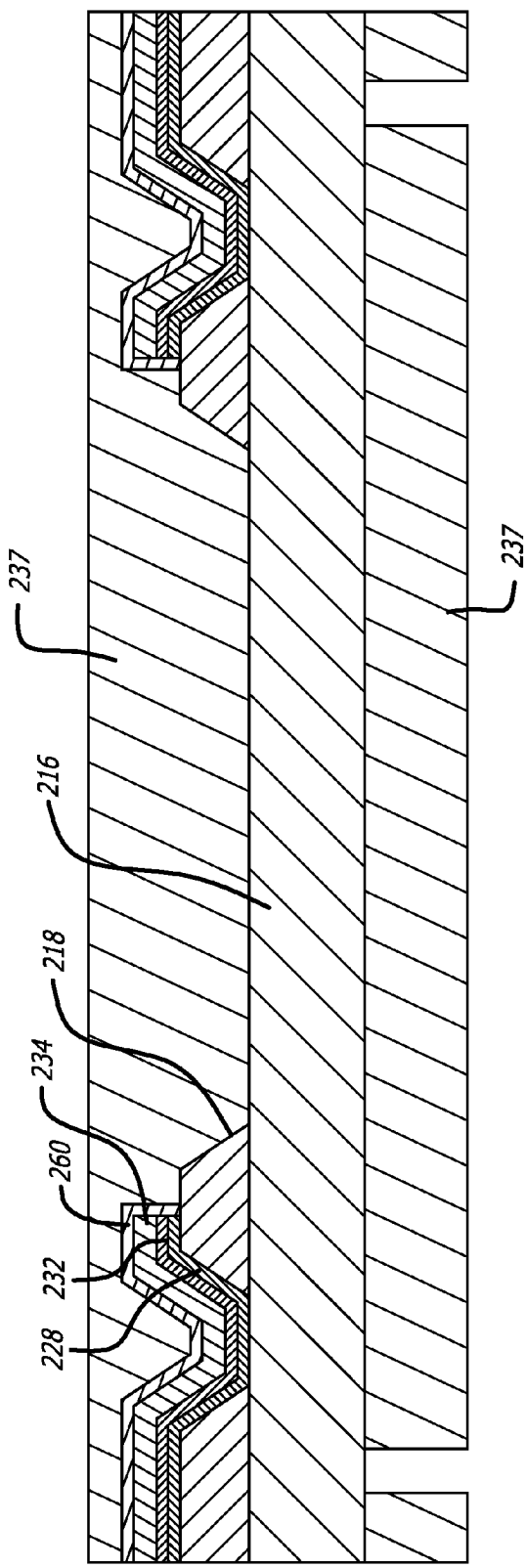

In FIG. 39 additional photoresist 237 is applied and patterned.

Figure 40:
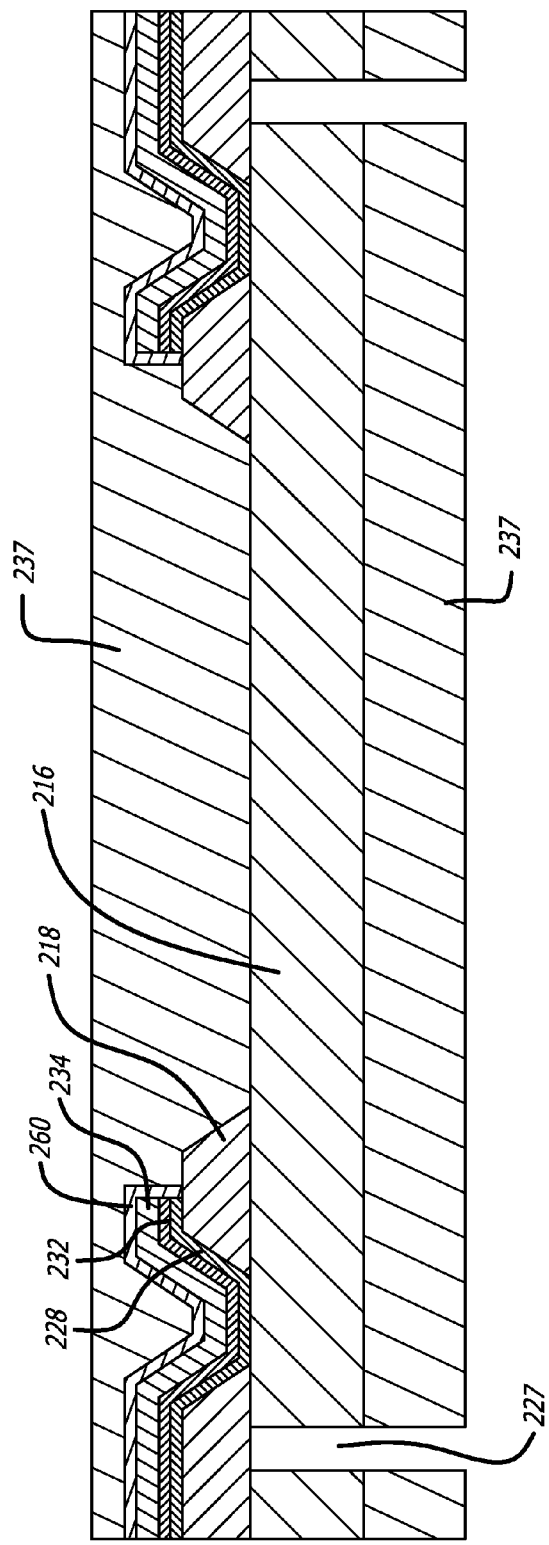

In FIG. 40 an etchant, typically ferric chloride, is used to create the desired pattern in the stainless steel layer. The pattern includes voids 227 in the stainless steel.

Figure 41:
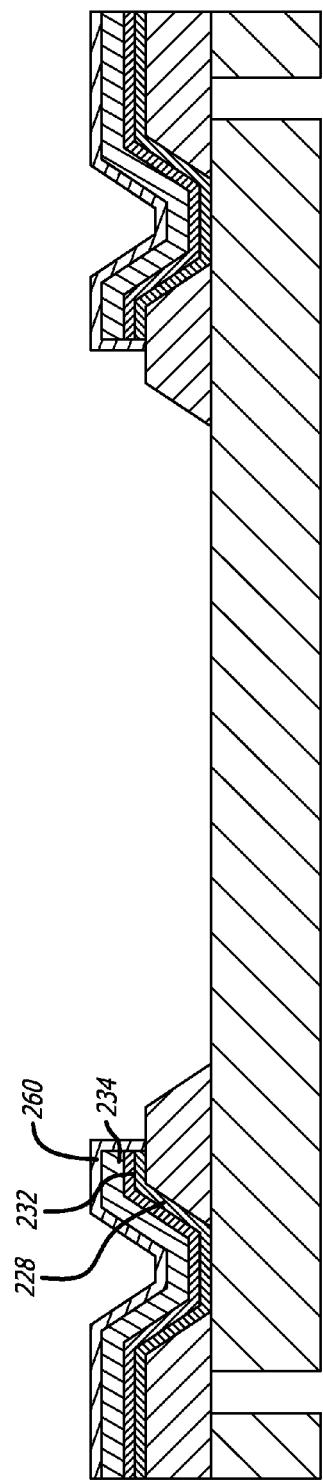

In FIG. 41 the photoresist is washed away, leaving bare stainless steel in flying lead region 250.

Figure 42:
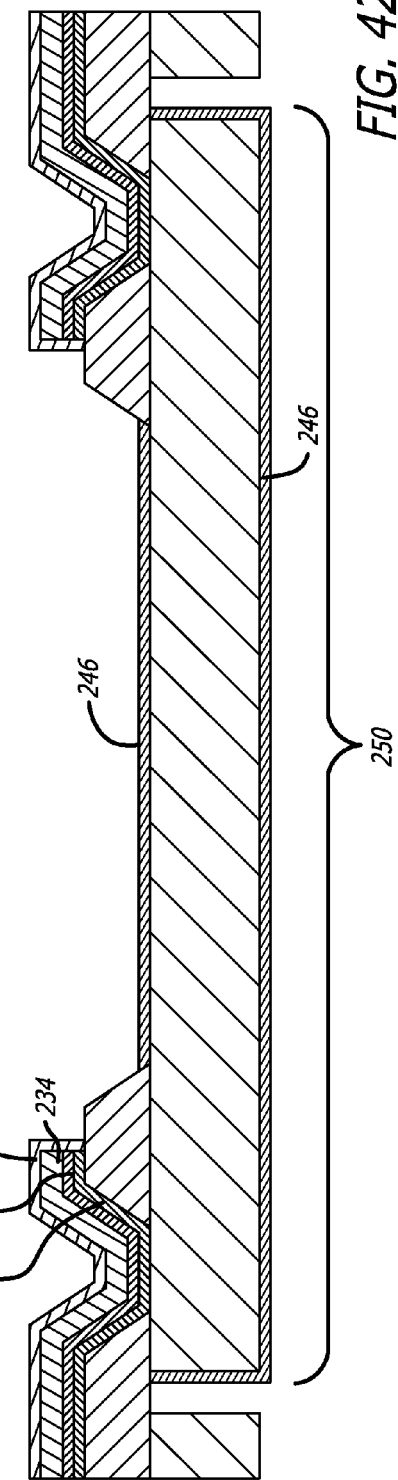

In FIG. 42, a bond-receptive layer 246 such as a gold layer is plated onto the stainless steel flying lead 251, using processes that will be described in detail below. Bond-receptive layer 246 facilitates both a satisfactory mechanical and electrical connection from an external electrical component to the flying lead.

It can be difficult to plate other metals directly onto stainless steel. In order to do so, the stainless steel must be specially prepared or activated. U.S. Pat. No. 4,422,906 issued to Kobayashi discloses a method for directly plating gold onto stainless steel, including activating the stainless steel surface prior to the plating operation. Kobayashi is hereby incorporated by reference for its teachings of preparing a stainless steel surface for gold plating, and for plating gold onto the stainless steel, as if fully set forth herein. Specifically, gold may be plated directly onto stainless steel using a method which comprises the steps of:

dipping or otherwise exposing stainless steel in an activating solution;

subjecting the activated stainless steel to cathode electrolytic activation; and then, electroplating the cathodically electrolyzed stainless steel with gold.

The activating solution used in the first step is preferably an aqueous mixed acid solution containing, based on the weight of the solution:

(i) 3 to 20% by weight of hydrochloric acid,
(ii) 2 to 30% by weight of sulfuric acid,
(iii) 0.1 to 5% by weight of a nonionic or cationic surface active agent and
(iv) 0.1 to 20% by weight of 2-pyrrolidone or its N-alkyl derivative.

More preferably, the activating solution used in the first step is an aqueous mixed acid solution containing, based on the weight of the solution:

(i) 3 to 10% by weight of hydrochloric acid,
(ii) 0.5 to 4% by weight of nitric acid,
(iii) 2 to 15% by weight of sulfuric acid,
(iv) 1 to 5% by weight of acetic acid,
(v) 3 to 10% by weight of citric acid,
(vi) 0.1 to 3% by weight of a nonionic or cationic surface active agent,
(vii) 0.1 to 10% by weight of 2-pyrrolidone or its N-alkyl derivative and
(viii) 1 to 5% by weight of an acetylenic glycol.

In FIG. 42, in the present embodiment gold layer 246 is deposited onto stainless steel layer 216 using any suitable method, including without limitation the methods taught by Kobayashi. Gold layer 246 serves several purposes. First, gold layer 246 provides a low resistance signal path on the skin of stainless steel, so that once the signal has traveled from via 225 to stainless steel flying lead 251 and through stainless steel flying lead 251 to gold layer 246, the electrical resistance encountered by the signal as it travels across flying lead region 250 is small. Second, gold layer 246 helps to prevent corrosion of the stainless steel 218 in critical flying lead region 251. Third, gold layer 246 provides a suitable material and surface for thermosonic bonding or soldering, allowing for relatively easy bonding and relatively easy rework.

As an alternative to plating gold directly on the stainless steel flying lead, a layer of copper or nickel may be strike plated upon the stainless steel lead in order to enhance the wetability of the plated gold layer. The nickel may be plated using a Woods Strike bath which by itself is known, being described in U.S. Pat. No. 3,645,861 issued to Garvey, which is fully incorporated by reference as if set forth herein. Furthermore, the nickel may be plated using the variation on the standard Woods Strike taught by Garvey, in which the nickel chloride and hydrochloric acid are replaced with nickel bromide and hydrobromic acid, which Garvey discloses as producing better adhesion of the nickel to the stainless steel than the standard Woods Strike bath. According to Garvey, the preferred plating bath comprises:

100-800 g/l, and preferably about 500 g/l, of nickel bromide, and 0.2-20% by weight, and preferably about 0.4% by weight, hydrobromic acid with the plating taking place at a current density of 5-200 amp per square foot. The resulting metallization could therefore be: SST/Au; SST/Ni/Au; SST/Cu/Au; SST/Cu/Ni/Au; SST/Ni/Cu/Ni/Au; or other variations that will be obvious to one skilled on the art after receiving the teachings of the present invention. The nickel and/or additional gold layers, when present, would constitute an additional metallic layer between the stainless steel flying lead and the gold bond-receptive layer.

The invention has been illustrated above with respect to flying leads that are essentially parallel strips or ribbons of unsupported, generally flat stainless steel foil, with the finished flying leads constituting parallel ribbons of thin rectangular stainless steel foil that are substantially free of insulative material on both sides for electronic access on both sides, and substantially free of any other material that would physically separate the parallel flying leads.

In a further embodiment, the invention can be applied to suspension circuit termination pads that are in the form of an array of solder ball bond pads, which are increasingly replacing unsupported parallel ribbons as termination structures in disk drive suspensions. In prior art solder ball bonding (SBB) terminations for suspension circuits, the circuit tail used to make the electrical connections has an array of solder ball bonding pads. Each pad is generally round in shape with a hole in it, and is made of unsupported copper. In a typical solder ball bonding process the pad is placed over a solder ball that is larger than the hole. The solder ball is then heated until it flows, and the bond pad is pressed against the surface to which the electrical connection is desired. The solder flows both underneath the pad, and also flows through the pad hole and onto the top of the pad. The hole allows the quality of the solder connection to be verified for quality control purposes from the top. The prior art pad itself is generally unsupported copper, with polyimide and possibly a stainless steel substrate defining a matrix that otherwise supports and mechanically connects the pads. In one prior art SBB tail, the shapes of the holes resemble keyholes, similar to the hole shapes shown in FIGS. 43-44. Because the SBB bond pads have previously been comprised of copper, which is a relatively soft material, SBB bond pads within the prior art have been somewhat fragile and prone to damage, especially during rework. The prior art SBB bond pads can be improved upon by modifying them according to the structures and techniques of the present invention.

Figure 43:
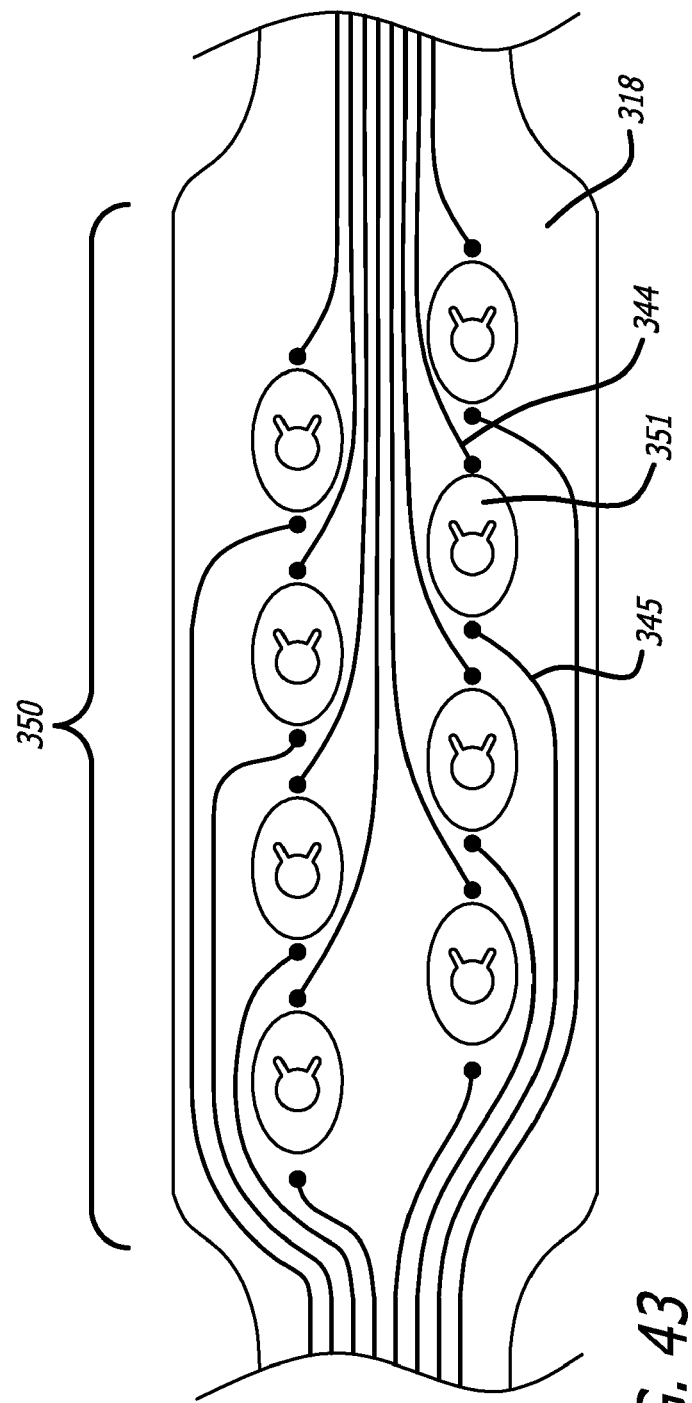
FIG. 43 is an oblique view of a solder ball bond pad tail in a disk drive suspension circuit, according to a further embodiment of the invention.

FIG. 43 is an oblique view of an SBB termination region 350 in a disk drive suspension circuit, according to an embodiment and application of the invention for solder ball boding. SBB termination region 350 may generally be substituted for flying lead region 250 of the embodiment shown in FIGS. 28-29 for those suspensions for which an SBB termination is desired. SBB termination region 350 includes a plurality of SBB bond pads. Representative SBB bond pad 351 is electrically connected to copper signal conductor 345 on its test pad side, and to copper signal conductor 344 on its slider side.

Figure 44:
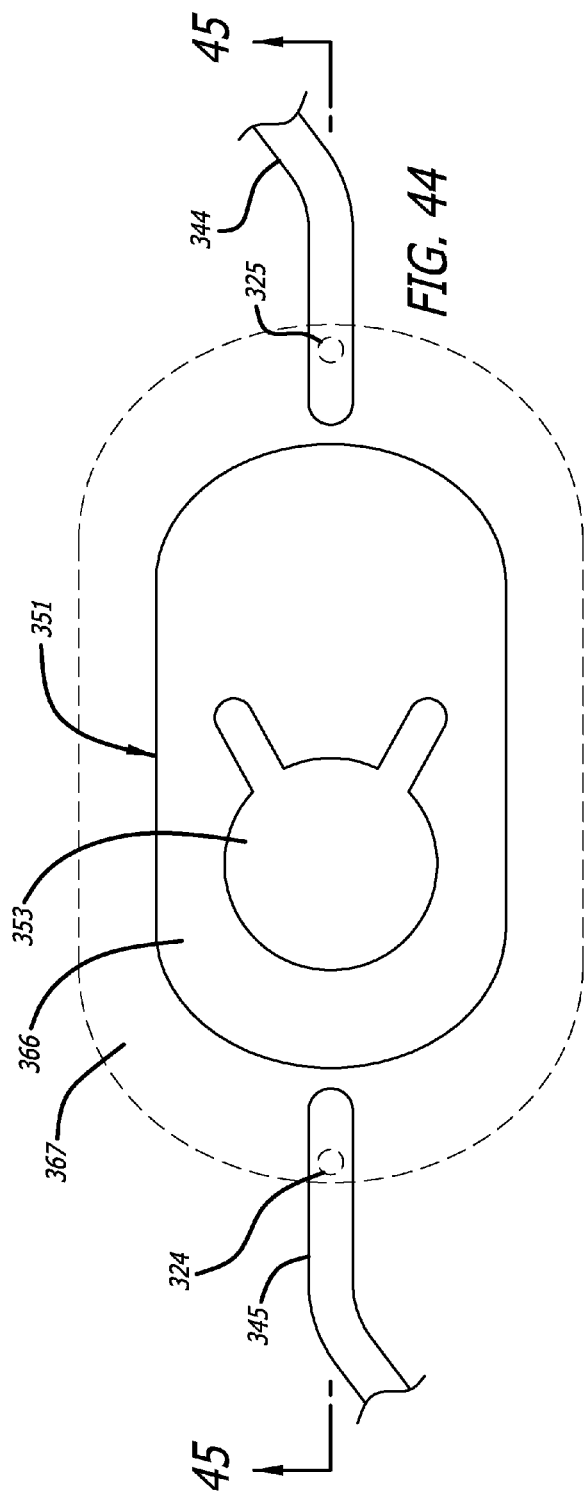
FIG. 44 is a top plan view of one of the solder ball bond pads of FIG. 43.

FIG. 44 is a close-up, top plan view of SBB bond pad 351 of FIG. 43. Copper signal conductor 345 is connected to bond pad 351 through via 324 which is shown in dashed lines because it is not visible from the outside. Similarly, copper signal conductor 344 is connected to bond pad 351 through via 325, which is also not visible from the outside. Polyimide or other suitable insulative material 318 surrounds the top surface 366 of bond pad 351. Bottom surface 367 of bond pad 351 is electrically isolated from other stainless steel material 317 (FIG. 45) on the bottom surface of SBB termination region 350. The portion 317 of stainless steel foil that does not form the SBB bond pads, can be an otherwise solid matrix of stainless steel on the underside of the termination region 350, or can have various patterns etched in it such as alternating strips of stainless steel and no stainless steel in order to control the signal impedance in termination region 350, or can be etched away altogether. In the exemplary embodiment shown, SBB bond pad 351 has a keyhole shaped hole 353 formed in it, with the hole shape by itself being within the prior art.

Figure 45:
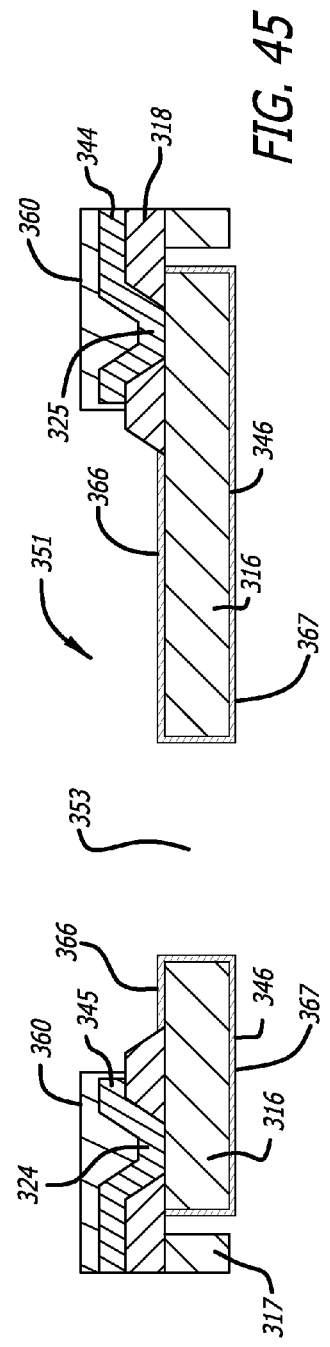
FIG. 45 is a simplified sectional view of the solder ball bond pad of FIG. 44, taken along section line 45-45.

FIG. 45 is a simplified sectional view of the solder ball bond pad of FIG. 44 taken along section line 45-45. The stainless steel 316, covered by gold layer 346, forms SBB bond pad 351 having hole 353 therethrough. Bond pad 351 has a top surface 366 and a bottom surface 367, both covered in gold. Bond pad hole 351 has a perimeter whose top surface is defined by top surface 366, and whose bottom surface is defined by bottom surface 367. Vias 224 and 225 extending through polyimide 318 electrically connect copper signal conductors 345 and 344 to SBB bond pad 351, respectively. Cover layer 360 provides environmental protection and insulation against shorting to copper signal conductors 344 and 345. It will be understood that a chromium or Monel® tie layer and a copper seed layer, analogous to chromium tie layer 228 and copper seed layer 232 in the embodiment of FIGS. 28-42 are preferably present, but omitted from FIG. 45 for simplicity of illustration. Further, although only a single gold layer 366 is shown over stainless steel 316, it will be understood that stainless steel 316 may be coated with multiple layers of nickel, copper, and/or gold, as discussed above with respect to FIGS. 28-42.

Because SBB bond pad 351 is unsupported by polyimide 318 on its top surface or its bottom surface, pad 351 may be referred to as a flying lead or terminal, or flying SBB bond pad.

The invention thus provides in disk drive suspension interconnects a highly conductive connection between e.g. copper/gold and stainless steel or copper/gold and stainless steel/copper components of a disk drive suspension, novel and improved methods of manufacturing disk drive suspension interconnects having this highly conductive connection using conductive adhesive-free, metallized vias extending between the copper/gold and stainless steel components of a disk drive suspension for grounding, in a particular case, a disk drive suspension slider to a stainless steel layer using the novel vias of the invention. The invention further provides a method for the manufacture of disk drive suspension interconnects with stainless steel layer grounded components using vias having an improved, low resistance electrical connection, specifically, metallized, modified vias to enhance copper/stainless steel bonding and electrical connection of suspension components thereby.

The invention further provides a resilient flying lead comprising primarily stainless steel, with gold thereon for thermosonic bonding and for soldering of electrical connections thereto, and for corrosion resistance. The copper of the signal conductor does not extend onto the flying lead; rather, the signal travels through the copper signal conductor on one end of the flying lead, through a first via provided in the dielectric layer at a first end of the flying lead and into the stainless steel, through the stainless steel, and back through a second via provided in the dielectric layer at a second end of the flying lead, and into the copper signal conductor at that second end.

It will be understood that the terms such as "approximately," "about," and "substantially" as used within the specification and the claims herein allows for a certain amount of variation from any exact dimensions, measurements, and arrangements, and that those terms should be understood within the context of the description and operation of the invention as disclosed herein.

It will further be understood that terms such as "top," "bottom," "above," and "below" as used within the specification and the claims herein are terms of convenience that denote the spatial relationships of parts relative to each other rather than to any specific spatial or gravitational orientation. Thus, the terms are intended to encompass an assembly of component parts regardless of whether the assembly is oriented in the particular orientation shown in the drawings and described in the specification, upside down from that orientation, or any other rotational variation.

It will be appreciated that the term "present invention" as used herein should not be construed to mean that only a single invention having a single essential element or group of elements is presented. Similarly, it will also be appreciated that the term "present invention" encompasses a number of separate innovations which can each be considered separate inventions. Although the present invention has thus been described in detail with regard to the preferred embodiments and drawings thereof, it should be apparent to those skilled in the art that various adaptations and modifications of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents.

We claim:

1. A circuit for a disk drive suspension, the circuit comprising:
    a first flexible circuit portion comprising:
        a first insulative layer; and
        a first copper signal conductor for electrical communication with a read/write head, the first copper signal conductor being disposed on the first insulative layer;
    a flying lead portion, the flying lead portion comprising:
        a generally flat stainless steel flying lead having at least a portion thereof that is substantially free of insulative material on at least one side, and having a top surface and a bottom surface, the top and bottom surfaces being sufficiently free of insulative material as to be electrically accessible on both sides; and
        a bond-receptive layer on the stainless steel flying lead, the bond-receptive layer being suitable for forming a mechanical and electrical bond to an external electrical component;
    wherein a first via extends through the first insulative layer and electrically connects the first copper signal conductor to the stainless steel flying lead.

2. The circuit of claim 1 wherein the via includes a chromium tie layer.

3. The circuit of claim 1 in combination with said external circuit component, and wherein:
    the bond-receptive layer is gold; and
    said external electrical component is bonded to the flying lead by a bond selected from the group consisting of thermosonic bonding and solder ball bonding.

4. The circuit of claim 1 wherein the bond-receptive layer comprises gold.

5. The circuit of claim 4 further comprising an intermediate metallic layer between the stainless steel flying lead and the gold.

6. The circuit of claim 5 wherein the intermediate metallic layer comprises nickel.

7. The circuit of claim 5 wherein the intermediate metallic layer comprises a layer of gold and a layer of nickel.

8. A circuit for a disk drive suspension, the circuit comprising:
   a first flexible circuit portion comprising:
      a first insulative layer; and
      a first copper signal conductor for electrical communication with a read/write head, the first copper signal conductor being disposed on the first insulative layer;
   a flying lead portion, the flying lead portion being generally rectangular in shape and comprising:
      a generally flat stainless steel flying lead having at least a portion thereof that is substantially free of insulative material on at least one side; and
      a bond-receptive layer on the stainless steel flying lead, the bond-receptive layer being suitable for forming a mechanical and electrical bond to an external electrical component;
   wherein a first via extends through the first insulative layer and electrically connects the first copper signal conductor to the stainless steel flying lead;
   the circuit further comprising a plurality of said rectangular flying lead portions arranged in parallel and without any material physically spacing the flying lead portions apart.

9. A circuit for a disk drive suspension, the circuit comprising:
   a first flexible circuit portion comprising:
      a first insulative layer; and
      a first copper signal conductor for electrical communication with a read/write head, the first copper signal conductor being disposed on the first insulative layer;
   a flying lead portion, the flying lead portion comprising:
      a generally flat stainless steel flying lead having at least a portion thereof that is substantially free of insulative material on at least one side; and
      a bond-receptive layer on the stainless steel flying lead, the bond-receptive layer being suitable for forming a mechanical and electrical bond to an external electrical component;
   wherein:
   a first via extends through the first insulative layer and electrically connects the first copper signal conductor to the stainless steel flying lead;
   the flying lead portion has a hole therethrough, an edge of the flying lead portion surrounding the hole defining a bonding pad hole perimeter, the bonding pad hole perimeter having an upper surface and a lower surface; and
   the bond-receptive layer is gold, the gold covering both the bonding pad hole perimeter upper and lower surfaces.

10. A circuit for a disk drive suspension, the circuit comprising:
    a first flexible circuit portion comprising:
       a first insulative layer; and
       a first copper signal conductor for electrical communication with a read/write head, the first copper signal conductor being disposed on the first insulative layer;
    a flying lead portion, the flying lead portion comprising:
       a generally flat stainless steel flying lead having at least a portion thereof that is substantially free of insulative material on at least one side; and
       a bond-receptive layer on the stainless steel flying lead, the bond-receptive layer being suitable for forming a mechanical and electrical bond to an external electrical component;
    wherein:
    a first via extends through the first insulative layer and electrically connects the first copper signal conductor to the stainless steel flying lead; and
    the only electrically conductive path between the first copper signal conductor and the stainless steel flying lead is through the via.

11. A circuit for a disk drive suspension, the circuit comprising:
    a first flexible circuit portion comprising:
       a first insulative layer; and
       a first copper signal conductor for electrical communication with a read/write head, the first copper signal conductor being disposed on the first insulative layer;
    a flying lead portion, the flying lead portion having a first end and a second end and comprising:
       a generally flat stainless steel flying lead having at least a portion thereof that is substantially free of insulative material on at least one side; and
       a bond-receptive layer on the stainless steel flying lead, the bond-receptive layer being suitable for forming a mechanical and electrical bond to an external electrical component;
    wherein a first via extends through the first insulative layer and electrically connects the first copper signal conductor to the stainless steel flying lead;
    the circuit further comprising:
       a second flexible circuit portion comprising:
       a second insulative layer;
       a second copper signal conductor, the second copper signal conductor being disposed on the second insulative layer;
       a second via extending through the second insulative layer and electrically connecting the second copper signal conductor to the stainless steel flying lead;
    wherein the stainless steel flying lead defines a stainless steel flying lead disposed between and electrically connected to the first and second flexible circuit portions through the first and second vias, respectively, the stainless steel flying lead being suitable for mechanical and electrical bonding directly thereto.

12. The circuit of claim 11 wherein:
    the flying lead portion has a hole formed therethrough to facilitate solder ball bonding, the flying lead portion with the hole therethrough defining a solder ball bonding pad.

13. A circuit for carrying read/write signals in a disk drive suspension, the circuit comprising:
    a plurality of copper signal conductors;
    a plurality of stainless steel leads disposed at least partly below the copper signal conductors, the copper signal conductors being in electrical communication with respective ones of the stainless steel leads through respective conductive vias that extend through insulative material physically separating the copper signal conductors from the stainless steel leads;
    the stainless steel leads each having respective gold layers electrodeposited thereon to form respective exposed bond pads suitable for bonding to external electrical components.

14. The circuit of claim 13 wherein the bond pads have respective holes formed therethrough for solder ball bonding.

15. The circuit of claim 13 wherein the bond pads comprise stainless steel covered with gold on a top surface and on a bottom surface thereof.

16. The circuit of claim 13 wherein the stainless steel leads are rectangular ribbons, the stainless steel ribbons defining gold-covered flying leads, and the flying leads having at least respective portions thereof that are not maintained physically separated from one another by any of said insulative material.

17. The circuit of claim 13 wherein the stainless steel leads each have an intermediate metal layer deposited thereon, the gold layers being electrodeposited over the intermediate metal layers.

18. The circuit of claim 13 wherein the conductive vias are the only conductive paths carrying read/write signals between the copper signal conductors and the respective stainless steel leads below.

* * * * *